United States Patent
Hobbs et al.

(10) Patent No.: US 6,432,779 B1
(45) Date of Patent: Aug. 13, 2002

(54) SELECTIVE REMOVAL OF A METAL OXIDE DIELECTRIC

(75) Inventors: Christopher Hobbs; Rama I. Hegde; Philip J. Tobin, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/772,632

(22) Filed: Jan. 30, 2001

Related U.S. Application Data

(63) Continuation-in-part of application No. 09/574,732, filed on May 18, 2000.

(51) Int. Cl.$^7$ ............... H01L 21/336; H01L 21/8242
(52) U.S. Cl. .......................... 438/287; 438/240
(58) Field of Search ................ 438/287, 3, 240, 438/469, 785, 790

(56) References Cited

U.S. PATENT DOCUMENTS 5,885,877 A    3/1999   Gardner et al.
6,300,202 B1 * 10/2001  Hobbs et al. ............... 438/287

* cited by examiner

Primary Examiner—John F. Niebling
Assistant Examiner—Walter L. Lindsay, Jr.
(74) Attorney, Agent, or Firm—Kim-Marie Vo

(57) ABSTRACT

A method for forming a semiconductor device is disclosed in which a metal oxide gate dielectric layer is formed over a substrate. A gate electrode is then formed over the metal oxide layer thereby exposing a portion of the metal oxide layer. The exposed portion of the metal oxide gate dielectric layer is then chemically reduced to a metal or a metal hydride. The metal or metal hydride is then removed with a conventional wet etch or wet/dry etch combination. The metal oxide layer may include a metal element such as zirconium, tantalum, hafnium, titanium, or lanthanum and may further include an additional element such as silicon or nitrogen. Reducing the metal oxide layer may includes annealing the metal oxide gate dielectric layer in an ambient with an oxygen partial pressure that is less than a critical limit for oxygen desorption at a given temperature. In another embodiment, reducing the metal oxide gate dielectric layer may include annealing the metal oxide layer while supplying a hydrogen-containing precursor such as silane, ammonia, germane, hydrogen, and hydrazine to the metal oxide gate dielectric layer. The gate electrode may comprise a gate electrode stack that includes a titanium nitride layer over the metal oxide gate dielectric layer and a silicon-containing capping layer over the titanium nitride layer.

2 Claims, 2 Drawing Sheets

SELECTIVE REMOVAL OF A METAL OXIDE DIELECTRIC

RELATED APPLICATION

This appl. is a continuation-in-part of U.S. application Ser. No. 09/574,732, filed May 18, 2000.

The present invention is related to the subject matter of co-pending patent application of Hegde et al., entitled, "Polysilicon Compatible Metal-Oxide Gate Dielectric Process", application Ser. No. 09/575,204 and filed May 18, 2000, which shares a common assignee with the present application and is incorporated by reference herein.

FIELD OF THE INVENTION

The present invention is related to the field of semiconductor fabrication and more particularly to a method for selectively removing a metal oxide film from a wafer.

RELATED ART

In a conventional metal oxide gate dielectric CMOS process, the gate dielectric must be selectively removed from source/drain regions of the wafer prior to source/drain implants to prevent metal in the dielectric film from being introduced into the substrate during the implant. Unfortunately, removal of the metal oxide dielectric using conventional dry etch processes lacks adequate selectivity with respect to silicon because of the large physical or sputtering component required to remove the metal oxide. This lack of selectivity may result in undesirable etching of the silicon substrate thereby rendering conventional dry etch techniques impractical for production. In addition, metal oxide dielectrics are not readily susceptible to wet etch processing. While concentrated HF solutions are capable of etching metal oxides, the etch rate is undesirably slow and the etch uniformity is poor. Moreover, if portions of an underlying isolation structure are exposed during the wet etch of a metal oxide dielectric film using a hydrofluoric acid (HF) solution, such as concentrated HF, the solution may rapidly etch the exposed portions of the isolation structure. Furthermore, the concentrated HF solution can also undercut spacer structures on the sidewalls of a gate electrode thereby possibly exposing the metal gate itself. Exposing the metal gate is undesirable because the concentrated HF or subsequent processes can attack it. Therefore, it would be highly desirable to implement a fabrication process using a metal oxide dielectric that enabled selective removal of the metal oxide dielectric without significantly affecting other structures on the wafer and without significantly increasing the cost or complexity of the process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally speaking, the present invention contemplates a process in which exposed portions of a metal oxide film are reacted to change the material properties of the exposed portions and thereafter an etch or functionally similar process is used to remove the reacted portions of the film. By initially altering the material properties of the metal oxide, the invention enables the use of conventional etch processing to remove selectively the altered portions of the metal oxide without adversely affecting existing structures on a wafer. In one embodiment, portions of the metal oxide film are reacted with a hydrogen containing compound to reduce the metal oxide and form a metal hydride that is easily removed from the wafer.

Figure 1:
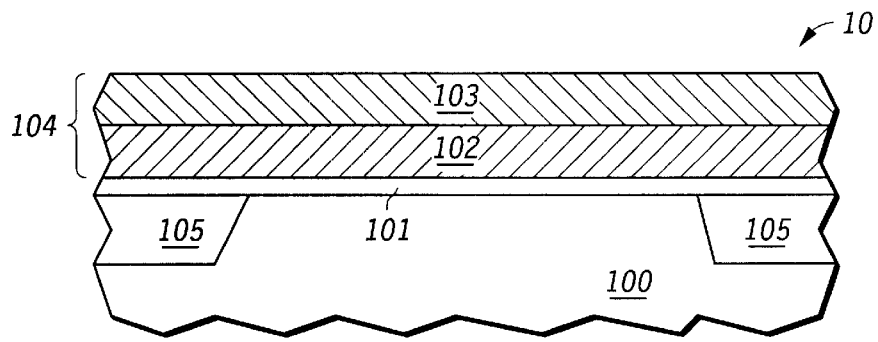
FIG. 1 is a partial cross sectional view of a semiconductor wafer in which a gate layer is formed over a metal oxide gate dielectric.

Turning now to the drawings, FIGS. 1–4 illustrate partial cross sectional views of a semiconductor substrate at various stages in a processing sequence according to one embodiment of the present invention. FIG. 1 illustrates a partial cross sectional view of a semiconductor wafer 10 including a semiconductor device substrate 100 into which isolation trenches 105 have been formed according to well known semiconductor fabrication techniques. Semiconductor device substrate 100 typically includes a single crystal silicon or other semiconductive material. In one embodiment, semiconductor device substrate 100 may include a relatively lightly doped epitaxial layer formed over a relatively heavily doped semiconductor bulk. In another embodiment, semiconductor device substrate 100 may comprise a silicon-on-insulator (SOI) structure in which a single crystal semiconductor layer such as doped silicon is formed over an insulator such as silicon dioxide. Typically, the isolation trenches 105 formed in substrate 100 are comprised of an electrically insulating material such as silicon dioxide, ($SiO_2$) or silicon nitride ($Si_3N_4$).

In the depicted embodiment, a metal oxide gate dielectric layer (metal oxide layer) 101 is formed over semiconductor device substrate 100. As its name suggests, metal oxide layer 101 is typically a composite material including a first element and a second element where the first and second elements are different and where the first element is a metal and the second element is oxygen. Metals suitable for use as the first element in metal oxide layer 101 include zirconium (Zr), tantalum (Ta), hafnium (Hf), titanium (Ti), and lanthanum (La). In other embodiments, metal oxide layer 101 may include a third element that is different from the first and second elements, such as silicon, aluminum, or nitrogen, and possibly a fourth element that is different from the first, second, and third elements including silicon, nitrogen, carbon, or aluminum. Thus metal oxide layer 101 may comprise a metal oxide silicate ($Me_xO_ySi_z$, where Me represents a metal), a metal oxynitride ($Me_xO_yN_z$), or a metal oxynitride silicate ($Me_wO_xSi_yN_z$).

Typically, metal oxide layer 101 has a dielectric constant that is greater than the dielectric constant of traditional gate dielectrics such as thermally formed silicon dioxide. In embodiments in which metal oxide layer 101 includes only a metal element and oxygen, the dielectric constant of the film is typically in the range of approximately 20–30. In embodiments where metal oxide layer 101 includes third or fourth elements, the dielectric constant film is typically in the range of approximately 10–20. Metal oxide layer 101 is typically formed with a chemical vapor deposition process using a first source gas containing the metal element and oxygen. The deposition process may be assisted by "co-flowing" a second source gas such as oxygen ($O_2$) or nitric oxide (NO). In an alternative embodiment, an inert co-flow gas such as nitrogen ($N_2$) may be used in the metal oxide deposition process. In embodiments where metal oxide layer 101 forms the gate dielectric of a CMOS transistor, a suitable thickness for the film is in the range of approximately 2–8 nanometers.

FIG. 1 further depicts a gate electrode stack 104 formed over metal oxide layer 101. In the depicted embodiment, in which gate electrode stack 104 is a dual layer gate electrode stack, the formation of gate electrode stack 104 includes forming a first gate electrode layer 102 over metal oxide layer 104 and capping first gate electrode layer 102 with a second gate electrode layer (capping layer) 103. First and second gate electrode layers 102 and 103 are typically formed with chemical vapor deposition processes.

Suitable materials for first gate electrode layer 102 include titanium nitride (TiN), tungsten nitride (WN), and silicon-germanium (SiGe) while suitable materials for capping layer 103 include silicon (including polysilicon), silicon-germanium, and tungsten (W). In embodiments in which second gate electrode layer 103 is polysilicon, the presence of first gate electrode layer 102 is useful in preventing reactions between the polysilicon deposition ambient (i.e., silane) and metal oxide layer 101 that can consume significant portions of metal oxide 101. In another embodiment, gate electrode stack 104 is comprised of a single layer such as polysilicon or other conductive or semiconductive material. In this embodiment, reactions between the polysilicon and metal oxide layer 101 during polysilicon deposition may be reduced by replacing the hydrogen source gas typical of polysilicon deposition processes with an inert source such as nitrogen, depositing the silicon at a lower temperature (i.e., a temperature less than approximately 600 C.), or forming a silicon dioxide film at an upper portion of the metal oxide layer 101 prior to polysilicon deposition. In another embodiment, metal oxide layer 101 may be annealed at a temperature that is greater than the polysilicon deposition temperature prior to deposition to produce a more robust metal oxide film that is less susceptible to reaction during polysilicon deposition. In one embodiment, a rapid thermal process (RTP) silicon deposition is utilized to form the polysilicon layer. The lack of oxygen in the RTP silicon process chamber (relative to a conventional furnace process) beneficially reduces oxidation of any underlying metal layer during polysilicon deposition. A typical thickness of gate electrode stack 104 is in the range of approximately 100–200 nanometers.

Figure 2:
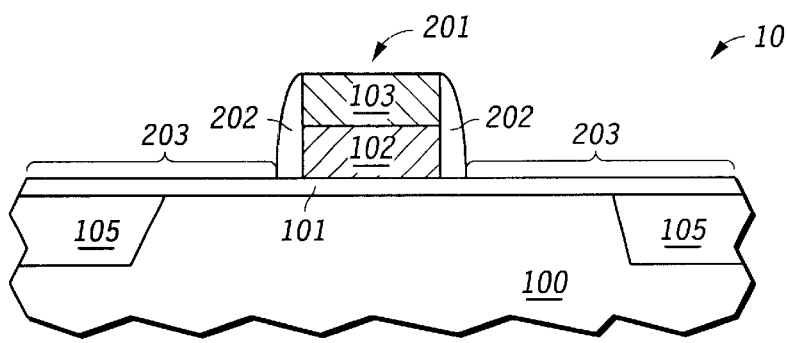
FIG. 2 is a processing step subsequent to FIG. 1 in which the gate layer is patterned to form a gate electrode over the metal oxide gate dielectric.

Turning now to FIG. 2, a gate electrode 201 is formed thereby exposing portions 203 of metal oxide layer 101. The formation of gate electrode 201 typically includes patterning gate electrode stack 104 with a conventional gate mask and etching gate electrode stack 104 according to the gate mask to define gate electrode 201. In the depicted embodiment, gate electrode 201 includes a portion of first gate electrode layer 102 over metal oxide layer 101 and a portion of second gate electrode layer 103 over first gate electrode layer 102. In the depicted embodiment, the formation of gate electrode 201 further includes forming narrow (i.e., less than 20 nanometers in thickness) spacer structures 202 adjacent the sidewalls of gate electrode 201. In embodiments where first gate electrode layer 102 is a titanium nitride material, formation of narrow spacers 202 following gate etch beneficially prevents subsequent reaction of first gate electrode layer 102.

The formation of gate electrode 201 exposes portions 203 of metal oxide layer 101. In the depicted embodiment, exposed portions 203 of metal oxide 101 include all areas of metal oxide layer 101 not directly under a gate electrode 201. It is desirable to remove exposed portions 203 of metal oxide layer 101 prior to subsequent processing and, more particularly, prior to a subsequent ion implantation process to prevent the high energy implant from "knocking" metallic elements within metal oxide layer 101 into substrate 100. It is theorized that the high energy implantation of a dopant into substrate 100 while exposed portions 203 of metal oxide layer 101 are still present on wafer 10 may result in a transfer of the metallic element in metal oxide layer 101 into substrate 100. The presence of this metallic element in substrate 100 may undesirably reduce device performance by increasing leakage currents and decreasing carrier mobility. Unfortunately, conventional dry etch processes lack sufficient selectivity with respect to the underlying silicon to provide an adequate process for removing exposed portions 203 of metal oxide 101. Furthermore, wet removal of exposed portions 203 of metal oxide layer 101 typically requires extended immersion of wafer 10 in a chemical solution such as HF or other suitable wet etch solution that may remove the metal oxide from underneath the spacer and expose layer 102 to the chemical solution. In addition, such a wet etch process typically results in undesired etching of isolation dielectric structures 105. The present invention, contemplates altering the material properties of exposed portions 203 of metal oxide layer 101 to facilitate a manufacturing compatible etch process.

Figure 3:
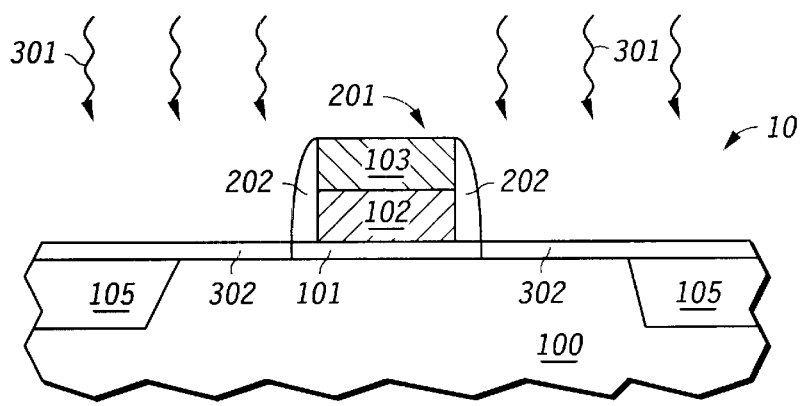
FIG. 3 is a processing step subsequent to FIG. 2 in which exposed portions of the metal oxide gate dielectric are chemically reduced.

Turning now to FIG. 3, exposed portions 203 of metal oxide layer 101 are converted to a material 302 that is susceptible to a conventional etch process and exhibits adequate selectivity with respect to silicon, silicon oxide, and silicon nitride. In one embodiment, this conversion process includes annealing wafer 10 in a reducing ambient 301 at a temperature of approximately 800 C. for a duration in the range of approximately 30–90 seconds. As its name implies, reducing ambient 301 chemically reduces exposed portions 203 of metal oxide layer 101 such that the oxidation number of the metallic component of exposed portions 203 of metal oxide layer 101 decreases. Reducing ambient 301 may include a hydrogen containing precursor such as ammonia ($NH_3$), silane ($SiH_4$), germane ($GeH_4$), dichlorosilane ($SiCl_2H_2$) or hydrazine ($H_4N_2$) that reacts with portions 203 of metal oxide layer 101 to produce a metal or a metal hydride material 302. In an embodiment in which reducing ambient 301 includes silane, chlorine may be incorporated into reducing ambient 301 to prevent silicon from forming on substrate 10 during the reduction process. Depending upon the duration of an embodiment of the reduction process that uses a silane precursor, transformed material 302 may include a reduced metal oxide ($MeO_x$) film where Me represents the metallic element and where 0<x<2. If wafer 10 is further exposed to a silane containing reducing ambient, the reduction process may result in a transformed material 302 comprising a metal hydride, such as titanium hydride (TiH$_2$) in the case of a reduced titanium oxide filmGenerally, the material 302 to which metal oxide layer 101 is converted includes a metal or a metal hydride for embodiments in which reducing ambient 301 includes hydrogen. In other embodiments, the transformed material 302 may include a metal element, oxygen, and a third element such as nitrogen. In the case of a reduced titanium oxide film, the transformed material 302 may be suitably removed with a conventional wet etch process using, as an example, sulfuric acid and hydrogen peroxide. In an embodiment in which transformed material 302 comprises titanium hydride, the inherent instability of titanium hydride at temperatures above approximately 400 C. may result in the "automatic" removal of transformed material 302 by decomposition during the reduction process.

In one embodiment, reducing metal oxide layer 101 is accomplished by annealing wafer 10 in a low pressure, oxygen containing ambient where the partial pressure of oxygen in the ambient is less than a critical limit for oxygen desorption at the anneal temperature thereby resulting in a transformed material 302 comprised of a reduced titanium oxide (TiO$_x$) that may be removed with the sulfuric/peroxide solution. For an anneal temperature of approximately 400 degrees Celsius, the oxygen partial pressure is preferably less than approximately 7 mTorr.

In another embodiment, it is preferred to anneal metal oxide layer 101 in an oxygen environment at a temperature of approximately 800 degrees Celsius for a duration in the range of approximately 30–90 seconds prior to converting exposed portions 203 of metal oxide layer 101 to material 302. During the oxygen anneal, the thickness of the interfacial oxide between wafer 10 and metal oxide layer 203 increases. This will create a smoother surface after subsequent removal of metal oxide layer 203. This embodiment is especially useful if metal oxide layer 101 is HfO$_2$ In this embodiment, HfO$_2$ is exposed to a reducing ambient comprising ammonia to form a Hf-rich oxynitride. In another embodiment, the gate etch process, which uses oxygen during the last step of the etch, can use the oxygen of this step to thicken the interfacial oxide. In another embodiment, a low temperature plasma oxidation can be used to increase the interfacial layer's thickness. Preferably, the plasma oxidation occurs between 100 to 200 degrees Celsius.

Figure 4:
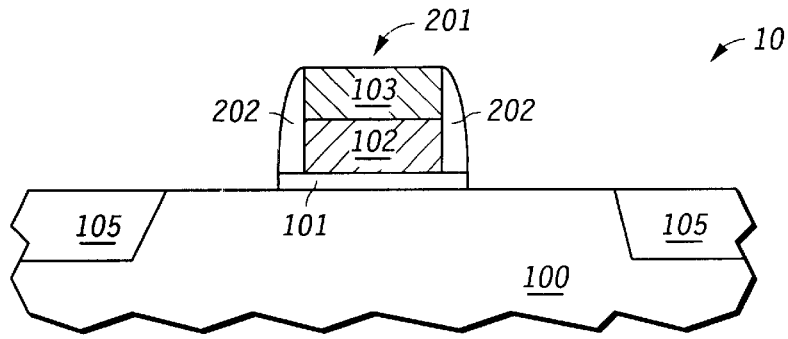
FIG. 4 is a processing step subsequent to FIG. 3 in which the reduced portions of the metal oxide gate dielectric are removed from the wafer.

Turning now to FIG. 4, transformed material 302 has been removed from wafer 10. In one embodiment, the removal of the transformed material 302 is accomplished by immersing wafer 10 in a solution of sulfuric acid and hydrogen peroxide. This embodiment is suitable for processes in which the transformed material 302 comprises a reduced titanium oxide material. In another embodiment, the removal of transformed material 302 is accomplished by immersing the wafer in a solution of phosphoric solution at a temperature of approximately 160 to 250 degrees Celsius for a duration of approximately 1–45 minutes. In other embodiments, the removal of the transformed material 302 occurs during the transformation process in which the exposed portions are converted to a metal hydride that is unstable at temperatures in excess of approximately 400 degrees Celsius. As an example, if the reducing ambient includes elemental hydrogen maintained at a temperature of approximately 800 C., exposed portions of the metal oxide film will react with the hydrogen to produce a metal hydride and water. By heating the ambient at a temperature in excess of the decomposition temperature of the metal hydride, the metal hydride film will decompose and evaporate during the transformation process. In this embodiment, wafer 10 may be immersed in a dilute HF solution for a short duration (i.e., approximately 60 seconds) to clean substrate 100 prior to further processing.

Figure 5:
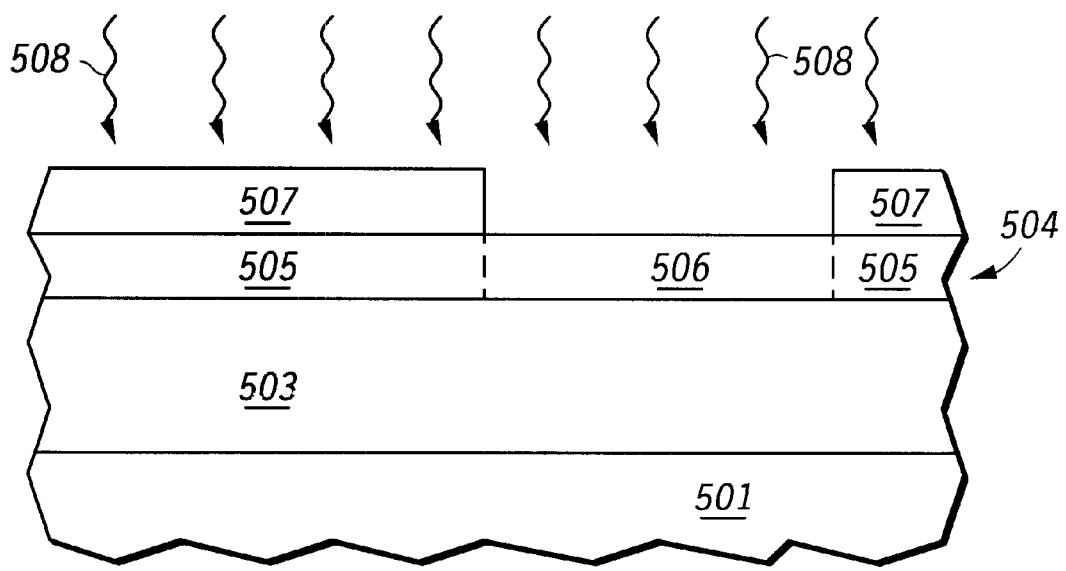
FIG. 5 is a partial cross sectional view of a semiconductor wafer in which a masking layer is patterned over a metal oxide layer and the exposed portions of the metal oxide layer are chemically reduced.

Turning now to FIG. 5, an alternative embodiment of the invention is depicted in which a metal oxide film is used to provide a hard mask for a subsequent etch process. In this embodiment, a first layer 503 is formed over a semiconductor substrate 501. A first layer 503 may include any of the variety of materials encountered in semiconductor fabrication including dielectrics such as silicon oxide compounds and silicon nitride as well as conductive and semiconductive materials including polysilicon. A metal oxide film 504 is formed over first layer 503. A patterning layer 507 is then formed over metal oxide layer 504 to define exposed portions 506 and unexposed portions 505 of metal oxide layer 504. The formation of patterning layer 507 may be achieved using conventional mask and etch processing. Patterning layer 507 may comprise, for example, silicon nitride or silicon oxide. Following the formation of patterning layer 507, the wafer is exposed to a reducing ambient 508 that transforms exposed portions 506 of gate oxide layer 504 to a material that may be selectively removed with respect to unexposed portions 505 of metal oxide layer 504. Reducing ambient 508 may include hydrogen or oxygen similar to the reducing ambient 301 described with respect to FIG. 3.

Figure 6:
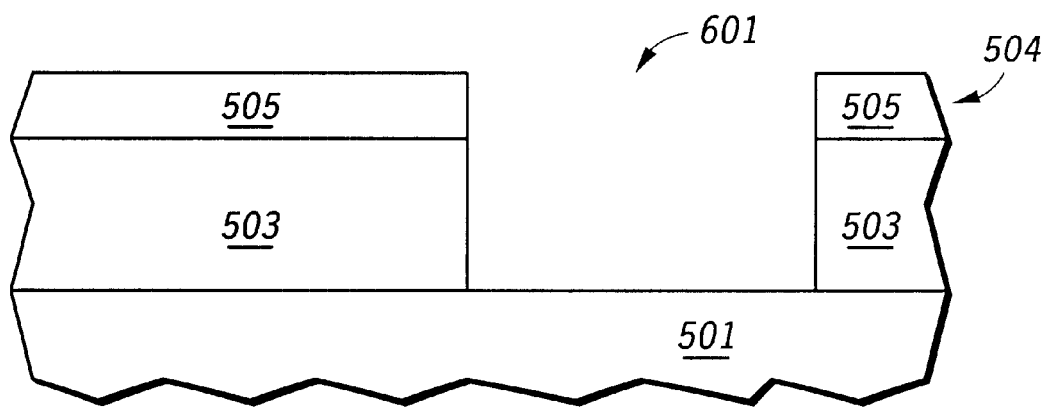
FIG. 6 is a processing step subsequent to FIG. 5 in which the reduced portions of the metal oxide layer are removed to form a metal oxide mask and a void is formed in an underlying layer according to the metal oxide mask.

Turning now to FIG. 6, following the exposure of wafer 10 to reducing ambient 508, the exposed portions 506 of metal oxide layer 504 are removed to expose underlying portions of first layer 503. After removal of patterning layer 507, it will be apparent that the unexposed portions 505 of metal oxide layer 504 define a mask on the underlying first layer 503. This metal oxide mask can be used during a subsequent etch process to produce a void 601 in first layer 503 defined by the mask. In this embodiment, the metal oxide layer may be used as a hard mask for a subsequent etch process. The high selectivity of the metal oxide layer with respect to the underlying layer is highly desirable to expand the manufacturing window of the etch process.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprising," "comprises",or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

forming a metal oxide gate dielectric layer over a semiconductor device substrate;

forming a gate electrode feature over the metal oxide gate dielectric layer, wherein forming the gate electrode feature exposes a portion of the metal oxide gate dielectric layer;

reducing the portion of the metal oxide gate dielectric layer to a portion that includes a material selected from a group consisting of a metal and a metal hydride; and removing the portion that includes the material selected from the group consisting of a metal and a metal hydride; and exposing a portion of the metal oxide gate dielectric layer to an oxygen environment.

2. The method of claim 1, wherein removing the portion that includes the material selected form the group consisting of a metal and a metal hydride further comprises placing the semiconductor device substrate in a phosphoric solution.

* * * * *